United States Patent
Liao et al.

(10) Patent No.: US 10,236,799 B2
(45) Date of Patent: Mar. 19, 2019

(54) DRIVING CIRCUIT FOR PIEZOELECTRICALLY ACTUATED PUMP

(71) Applicant: MICROJET TECHNOLOGY CO., LTD., Hsinchu (TW)

(72) Inventors: Jia-Yu Liao, Hsinchu (TW);
Shih-Chang Chen, Hsinchu (TW);
Chi-Feng Huang, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 328 days.

(21) Appl. No.: 15/386,762

(22) Filed: Dec. 21, 2016

(65) Prior Publication Data
US 2017/0194880 A1    Jul. 6, 2017

(30) Foreign Application Priority Data
Dec. 31, 2015 (TW) ................. 104144633 A

(51) Int. Cl.
*H02N 2/06* (2006.01)
*F04B 43/04* (2006.01)
*F04B 43/09* (2006.01)
*F04B 49/06* (2006.01)

(52) U.S. Cl.
CPC ............ *H02N 2/06* (2013.01); *F04B 43/046* (2013.01); *F04B 43/095* (2013.01); *F04B 49/06* (2013.01)

(58) Field of Classification Search
CPC  H02N 2/06; H02N 2/067; F04B 49/06; F04B 43/046; F04B 43/095
See application file for complete search history.

(56) References Cited

U.S. PATENT DOCUMENTS

| | | | |
|---|---|---|---|
| 4,358,742 A | 11/1982 | Ferriss | |
| 6,198,198 B1 | 3/2001 | Fujimura et al. | |
| 6,218,898 B1 | 4/2001 | Zanetti | |
| 7,432,771 B2 | 10/2008 | Chui | |
| 8,314,531 B2 * | 11/2012 | Sunaga | ................. H01L 41/042 310/317 |

(Continued)

FOREIGN PATENT DOCUMENTS

TW    200826448 A    6/2008
TW    201521341 A    6/2015

*Primary Examiner* — Bryan P Gordon
(74) *Attorney, Agent, or Firm* — Kirton McConkie; Evan R. Witt

(57) ABSTRACT

A driving circuit for a piezoelectrically actuated pump includes a boost converter, a control circuit and a voltage switch circuit. The boost converter outputs a constant voltage. The control circuit includes a voltage-division circuit, a comparator and a frequency adjustment circuit. The constant voltage is divided by the voltage-division circuit into a first voltage and a second voltage. The comparator compares first voltage with second voltage so as to output a positive voltage or a negative voltage. The voltage switch circuit receives and feedbacks positive voltage or negative voltage to the piezoelectric actuator load. The control circuit and the voltage switch circuit form a resonant circuit to control the piezoelectric actuator load according to the variety of minor voltage outputted form the piezoelectric actuator load. The frequency adjustment circuit detects and adjusts the variety of the minor voltage automatically so as to adjust operating frequency of the piezoelectric actuator load.

11 Claims, 4 Drawing Sheets

(56) References Cited

U.S. PATENT DOCUMENTS

| | | | | |
|---|---|---|---|---|
| 2007/0008047 A1* | 1/2007 | Karthaus | ............... | H03B 5/36 |
| | | | | 331/158 |
| 2007/0080606 A1* | 4/2007 | Hardy | ............... | F02D 41/2096 |
| | | | | 310/316.03 |
| 2009/0243431 A1* | 10/2009 | Ohsawa | ............... | F04B 43/046 |
| | | | | 310/317 |
| 2015/0043250 A1 | 2/2015 | Cho et al. | | |
| 2015/0312981 A1* | 10/2015 | Zhang | ............... | H02M 3/156 |
| | | | | 315/224 |

\* cited by examiner

DRIVING CIRCUIT FOR PIEZOELECTRICALLY ACTUATED PUMP

FIELD OF THE INVENTION

The present invention relates to a driving circuit, and more particularly to a driving circuit applicable to various piezoelectrically actuated pumps.

BACKGROUND OF THE INVENTION

Generally, a piezoelectric actuator of the piezoelectrically actuated pump is driven by a driving circuit when the piezoelectrically actuated pump is enabled. The piezoelectric actuator is operated continuously and periodically so as to drive the piezoelectrically actuated pump to operate correspondingly. A driving circuit for example a constant-frequency driving circuit or a high-voltage driving circuit can be employed to drive the piezoelectric actuator. The constant-frequency driving circuit outputs a voltage at constant frequency to drive the piezoelectric actuator, and the high-voltage driving circuit outputs a voltage at high level to drive the piezoelectric actuator for increasing the deformation of the piezoelectric actuator.

Generally, different piezoelectrically actuated pumps employ different piezoelectric actuators, and different piezoelectric actuators have different operating frequencies. For enabling different piezoelectrically actuated pumps to operate, different driving circuits are designed for respective piezoelectrically actuated pumps according to the piezoelectric actuators of the piezoelectrically actuated pumps. Consequently, the piezoelectrically actuated pumps have respective driving circuits, and the piezoelectric actuators of the piezoelectrically actuated pumps can be driven by respective driving circuits.

At present, the piezoelectric actuator of the piezoelectrically actuated pump needs a corresponding and exclusive driving circuit. Namely, if one piezoelectrically actuated pump is replaced by another piezoelectrically actuated pump, a new driving circuit is needed to be designed and employed for the piezoelectrically actuated pump. Under this circumstance, various driving circuits are designed according to different piezoelectrically actuated pumps. Consequently, the cost is high. In addition, if a constant-frequency driving circuit is employed to drive the piezoelectric actuator to operate, the constant-frequency driving circuit can only output the voltage at constant frequency and the voltage outputted from the constant-frequency driving circuit can't be adjusted to an optimized operating frequency required for the piezoelectric actuator automatically. Namely, the piezoelectric actuator can't be driven by the constant-frequency driving circuit to operate at an optimized operation condition. Furthermore, if a high-voltage driving circuit is employed to drive the piezoelectric actuator to operate, the piezoelectric actuator is damaged easily or the life time of the piezoelectric actuator is reduced when the deformation of the piezoelectric actuator is increased.

Therefore, it is desired to develop a driving circuit applicable to various piezoelectrically actuated pumps so as to obviate the issues encountered by the prior arts.

SUMMARY OF THE INVENTION

An object of the invention is to provide a driving circuit applicable to various piezoelectric actuators with different operating frequencies. Namely, the driving circuit is applicable to various piezoelectrically actuated pumps. Consequently, the cost is reduced significantly.

Another object of the present invention is to provide a driving circuit capable of adjusting the operating frequency of the piezoelectric actuator to a required operating frequency automatically. Consequently, different piezoelectric actuators of the piezoelectrically actuated pumps can be operated at optimized operating conditions, respectively.

In accordance with an aspect of the present invention, a driving circuit for a piezoelectrically actuated pump is provided. The piezoelectrically actuated pump includes a piezoelectric actuator load. The driving circuit includes a boost converter, a control circuit and a voltage switch circuit. The boost converter receives an input voltage and converts the input voltage into a stably constant voltage. The control circuit is electrically connected with the boost converter, receives the constant voltage outputted from the boost converter, and includes a voltage-division circuit, a comparator and a frequency adjustment circuit. The constant voltage is divided by the voltage-division circuit into a first voltage and a second voltage. The comparator receives the first voltage and the second voltage, compares the first voltage with the second voltage, and outputs a positive voltage or negative voltage according to a comparing result. The voltage switch circuit is electrically connected with the control circuit and receives the positive voltage or the negative voltage outputted from the comparator of the control circuit. The voltage switch circuit includes a half-bridge circuit including a first switch element and a second switch element. The voltage switch circuit receives the positive voltage or the negative voltage outputted from the comparator and feedback the positive voltage or the negative voltage to the piezoelectric actuator load so as to form a required positive voltage or a required negative voltage for the piezoelectric actuator load. The control circuit and the voltage switch circuit form a resonant circuit to control the operation of the piezoelectric actuator load according to the variety of the minor voltage outputted form the piezoelectric actuator load, and the frequency adjustment circuit of the control circuit detects and adjusts the variety of the minor voltage outputted from the piezoelectric actuator load so as to adjust an operating frequency of the piezoelectric actuator load to a required operating frequency.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
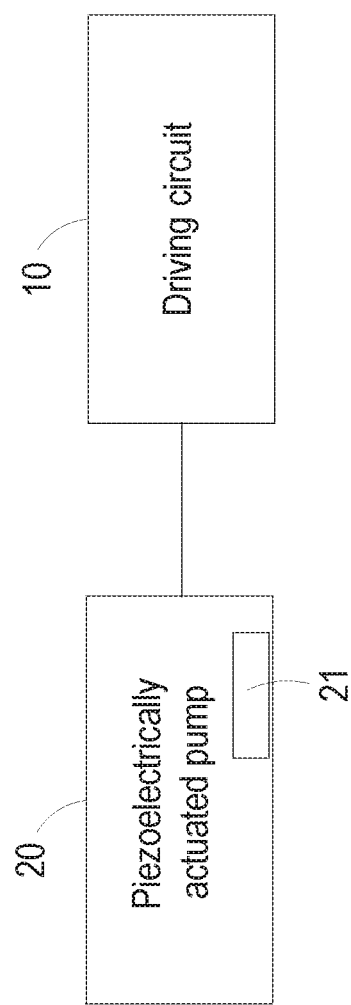
FIG. 1 is a schematic circuit block diagram illustrating a driving circuit for driving a piezoelectrically actuated pump according to a preferred embodiment of the present invention.

FIG. 1 is a schematic circuit block diagram illustrating a driving circuit for driving a piezoelectrically actuated pump according to a preferred embodiment of the present invention. As shown in FIG. 1, the driving circuit 10 is electrically connected with the piezoelectrically actuated pump 20. The driving circuit 10 receives an input voltage $V_{in}$, converts the input voltage $V_{in}$ into an AC voltage, and outputs the AC voltage for driving the piezoelectrically actuated pump 20 to operate. The piezoelectrically actuated pump 20 can be applied to various industrial fields including pharmaceutical biotechnology, computer science, printing or energy. The piezoelectrically actuated pump 20 can be employed to transport gas or liquid. The piezoelectrically actuated pump 20 includes a piezoelectric actuator load 21 for converting the electrical energy into mechanical energy so as to drive the piezoelectrically actuated pump 20 to operate correspondingly.

Figure 2:
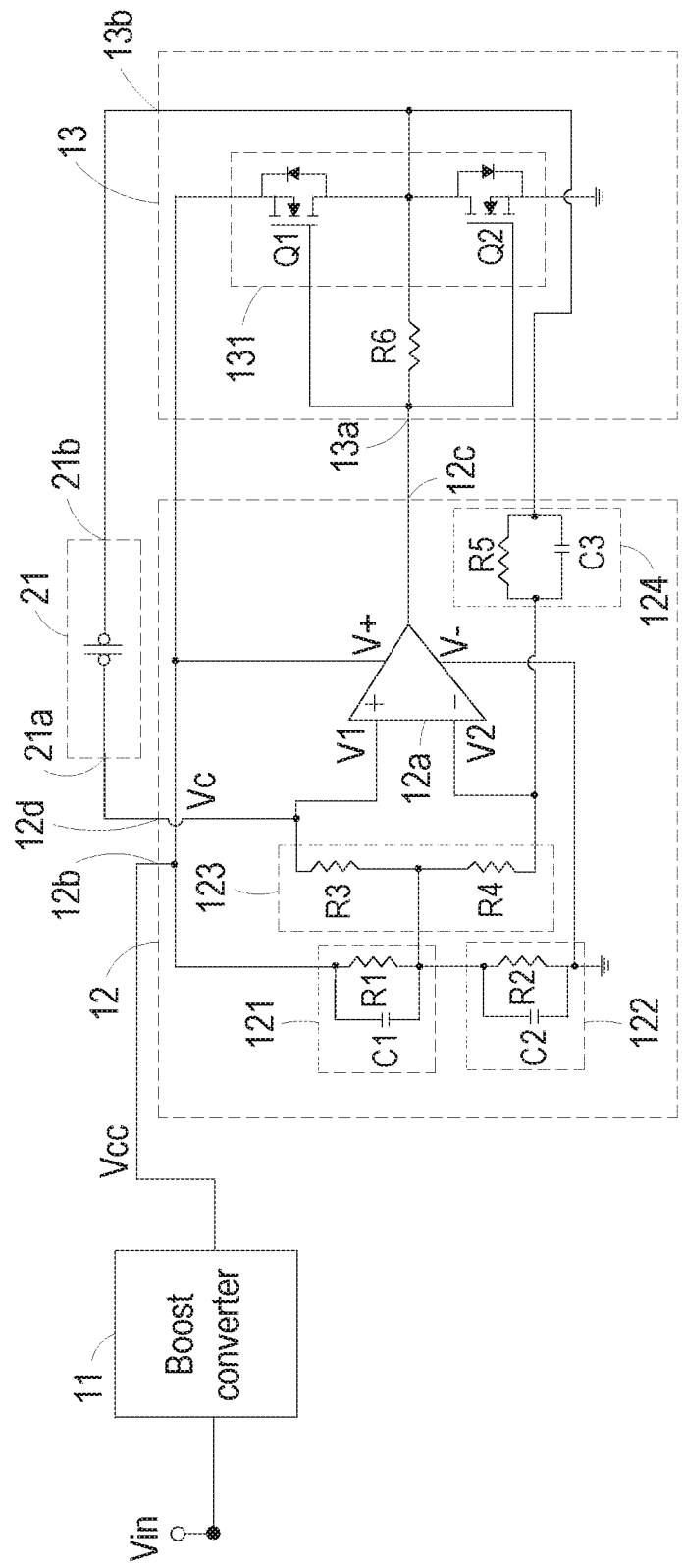
FIG. 2 is a schematic circuit block diagram illustrating a driving circuit and a piezoelectric actuator load of FIG. 1.

FIG. 2 is a schematic circuit block diagram illustrating a driving circuit and a piezoelectric actuator load of FIG. 1. As shown in FIG. 2, the driving circuit 10 provides AC voltage for driving the piezoelectric actuator load 21 to operate. The driving circuit 10 includes a boost converter 11, a control circuit 12 and a voltage switch circuit 13.

The boost converter 11 receives the input voltage $V_{in}$ and converts the input voltage $V_{in}$ into a stably constant voltage $V_{cc}$. The input terminal of the boost converter 11 is capable of receiving the input voltage $V_{in}$ at a wide range of level, and the output terminal of the boost converter 11 is capable of providing stably constant voltage $V_{cc}$ to the control circuit 12. Namely, the control circuit 12 is electrically connected with the boost converter 11, and the boost converter 11 provides the constant voltage $V_{cc}$ to the control circuit 12 for driving the control circuit 12 to operate.

The control circuit 12 includes an input terminal 12b for receiving the constant voltage $V_{cc}$ outputted from the boost converter 11 and an output terminal 12c electrically connected with the voltage switch circuit 13 for outputting a first voltage $V_1$ and a second voltage $V_2$ after the constant voltage $V_{cc}$ is divided. The control circuit 12 includes another input terminal 12d electrically connected with an output terminal 21a of the piezoelectric actuator load 21 for receiving a minor voltage $V_c$ outputted from the piezoelectric actuator load 21. The voltage switch circuit 13 includes an input terminal 13a electrically connected with the output terminal 12c of the control circuit 12. The voltage switch circuit 13 receives a positive voltage V+ or a negative voltage V− after the control circuit 12 compares the first voltage $V_1$ and the second voltage $V_2$ and output the positive voltage V+ or the negative voltage V− according to the comparing result. The voltage switch circuit 13 includes an output terminal 13b electrically connected with the input terminal 21b of the piezoelectric actuator load 21. The voltage switch circuit 13 receives the positive voltage V+ or the negative voltage V− and feedbacks the positive voltage V+ or the negative voltage V− to the piezoelectric actuator load 21 for allowing the input terminal 21b of the piezoelectric actuator load 21 to be at positive voltage V+ and allowing the output terminal 21a of the piezoelectric actuator load 21 to be at negative voltage V−, where the minor voltage $V_c$ at the output terminal 21a of the piezoelectric actuator load 21 is the negative voltage V− corresponding to the positive voltage V+. Alternatively, the voltage switch circuit 13 receives the positive voltage V+ or the negative voltage V− and feedbacks the positive voltage V+ or the negative voltage V− to the piezoelectric actuator load 21 for allowing the input terminal 21b of the piezoelectric actuator load 21 to be at negative voltage V− and allowing the output terminal 21a of the piezoelectric actuator load 21 to be at positive voltage V+, where the minor voltage $V_c$ at the output terminal 21a of the piezoelectric actuator load 21 is the positive voltage V+ corresponding to the negative voltage V−. Consequently, the control circuit 12 and the voltage switch circuit 13 form a resonant circuit to control the operation of the piezoelectric actuator load 21 according to the variety of the minor voltage $V_c$ outputted form the piezoelectric actuator load 21.

In the embodiment, the control circuit 12 includes a first resistor R1, a second resistor R2, a third resistor R3, a fourth resistor R4, a fifth resistor R5, a first capacitor C1, a second capacitor C2, a third capacitor C3, and a comparator 12a. The input terminal 12b of the control circuit 12 receives the constant voltage $V_{cc}$ outputted from the boost converter 11. The control circuit 12 includes a frequency adjustment circuit 121 electrically connected with the input terminal 12b and including the first resistor R1 and the first capacitor C1, where the first resistor R1 is connected in parallel with the first capacitor C1. One terminal of the frequency adjustment circuit 121 (i.e. the first resistor R1 and the first capacitor C1 connected in parallel with each other) is electrically connected with the input terminal 12b of the control circuit 12 and receives the constant voltage $V_{cc}$. The control circuit 12 includes an input-end voltage regulation circuit 122 electrically connected with the input terminal and including the second resistor R2 and the second capacitor C2, where the second resistor R2 is connected in parallel with the second capacitor C2. One terminal of the input-end voltage regulation circuit 122 (i.e. the second resistor R2 and the second capacitor C2 connected in parallel with each other) is electrically connected with the other terminal of the frequency adjustment circuit 121, and the other terminal of the input-end voltage regulation circuit 122 is ground. The control circuit 12 includes a voltage-division circuit 123 electrically connected with the input terminal and including a third resistor R3 and a fourth resistor R4, where the third resistor R3 is connected in series with the fourth resistor R4. One terminal of the voltage-division circuit 123 (i.e. the third resistor R3 and the fourth resistor R4 connected in series with each other) is electrically connected with the input terminal 12b of the control circuit 12 via the frequency adjustment circuit 121, and the voltage-division circuit 123 includes a first voltage output unit formed by the third resistor R3 and a second voltage output unit formed by the fourth resistor R4 electrically connected with a positive input terminal and a negative input terminal of the comparator 12a respectively for outputting the first voltage $V_1$ and the second voltage $V_2$ to the positive input terminal and the negative input terminal of the comparator 12a respectively. The comparator 12a compares the first voltage $V_1$ with the second voltage $V_2$ and outputs a positive voltage V+ or a negative voltage V− according to the comparing result. In this embodiment, the first voltage output unit of the voltage-division circuit 123 is electrically connected with the output terminal 21a of the piezoelectric actuator load 21 for receiving the minor voltage $V_c$. The control circuit 12 includes an output-end voltage regulation circuit 124 electrically connected with the second voltage output unit of the voltage-division circuit 123 and including the fifth resistor R5 and the third capacitor C3, where the fifth resistor R5 is connected in parallel with the third capacitor C3. One terminal of the output-end voltage regulation circuit 124 (i.e. the fifth resistor R5 and the third capacitor C3 connected in parallel with each other) is electrically connected with the second voltage output unit of the voltage-division circuit 123, and the other terminal of the output-end voltage regulation circuit 124 is electrically connected with the input terminal 21b of the piezoelectric actuator load 21 for regulating the voltage at the input terminal 21b of the piezoelectric actuator load 21.

In addition, the comparator 12a of the control circuit 12 compares the first voltage $V_1$ with the second voltage $V_2$ and outputs the positive voltage V+ or the negative voltage V− according to the comparing result. Namely, when the comparator 12a determines that the first voltage $V_1$ is larger than the second voltage $V_2$, the comparator 12a outputs positive voltage V+. When the comparator 12a determines that the first voltage $V_1$ is lower than the second voltage $V_2$, the comparator 12a outputs negative voltage V−.

The voltage switch circuit 13 includes a sixth resistor R6 and a half-bridge circuit 131. The half-bridge circuit 131 includes a first switch element Q1 and a second switch element Q2. The sixth resistor R6 of the voltage switch circuit 13 is configured to regulate voltage and limit current. One end of the sixth resistor R6 is electrically connected with the output terminal of the comparator 12a, and the other end of the sixth resistor R6 is electrically connected with the input terminal 21b of the piezoelectric actuator load 21. A first end of the first switch element Q1 is electrically connected with a first end of the second switch element Q2 and further electrically connected with the output terminal of the comparator 12a. A second end of the first switch element Q1 is electrically connected with a second end of the second switch element Q2 and further electrically connected with the input terminal 21b of the piezoelectric actuator load 21. The control end of the first switch element Q1 is electrically connected with the input terminal 12b of the control circuit 12 for receiving the constant voltage $V_{cc}$ outputted from the boost converter 11, and the control end of the second switch element Q2 is ground.

Figure 3A:
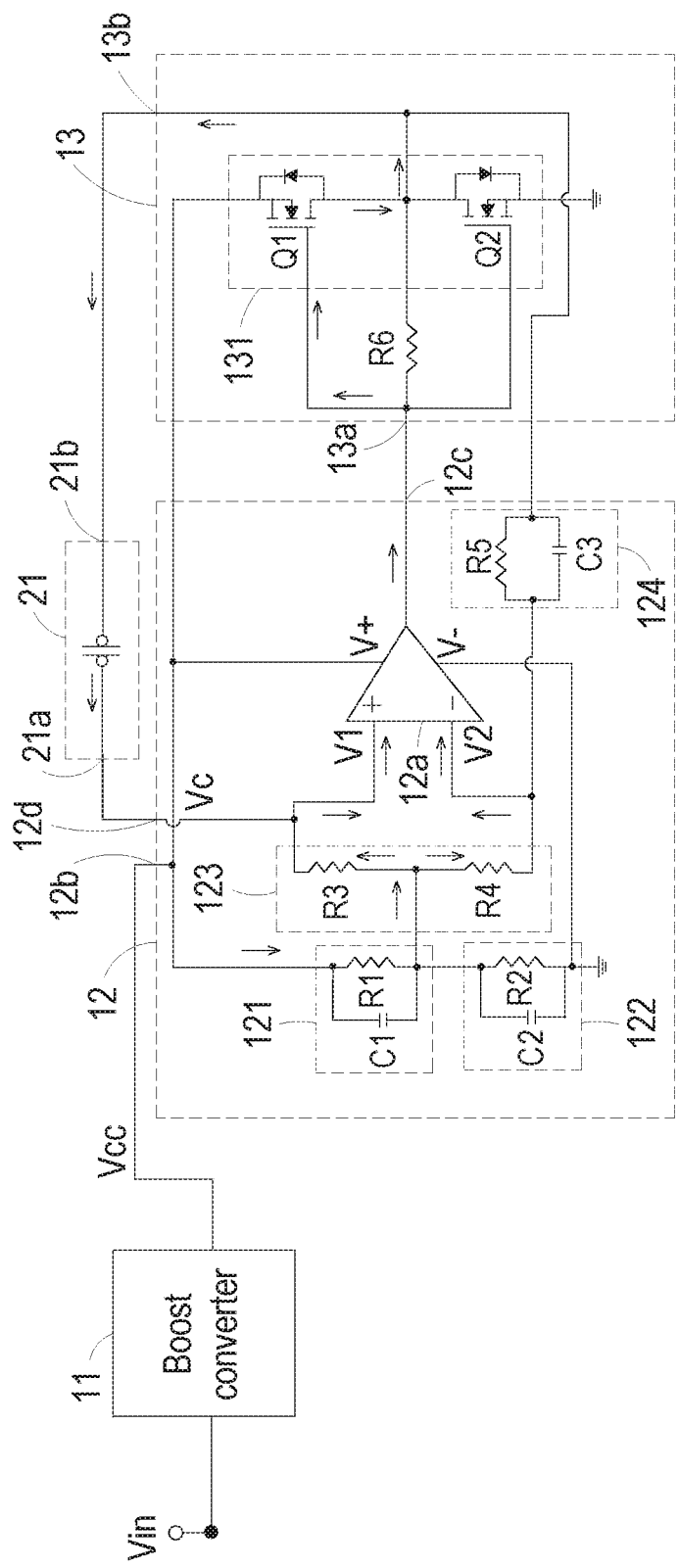
FIGS. 3A and 3B are schematic circuit diagrams illustrating the operations of the driving circuit according to the present invention.
Figure 3B:
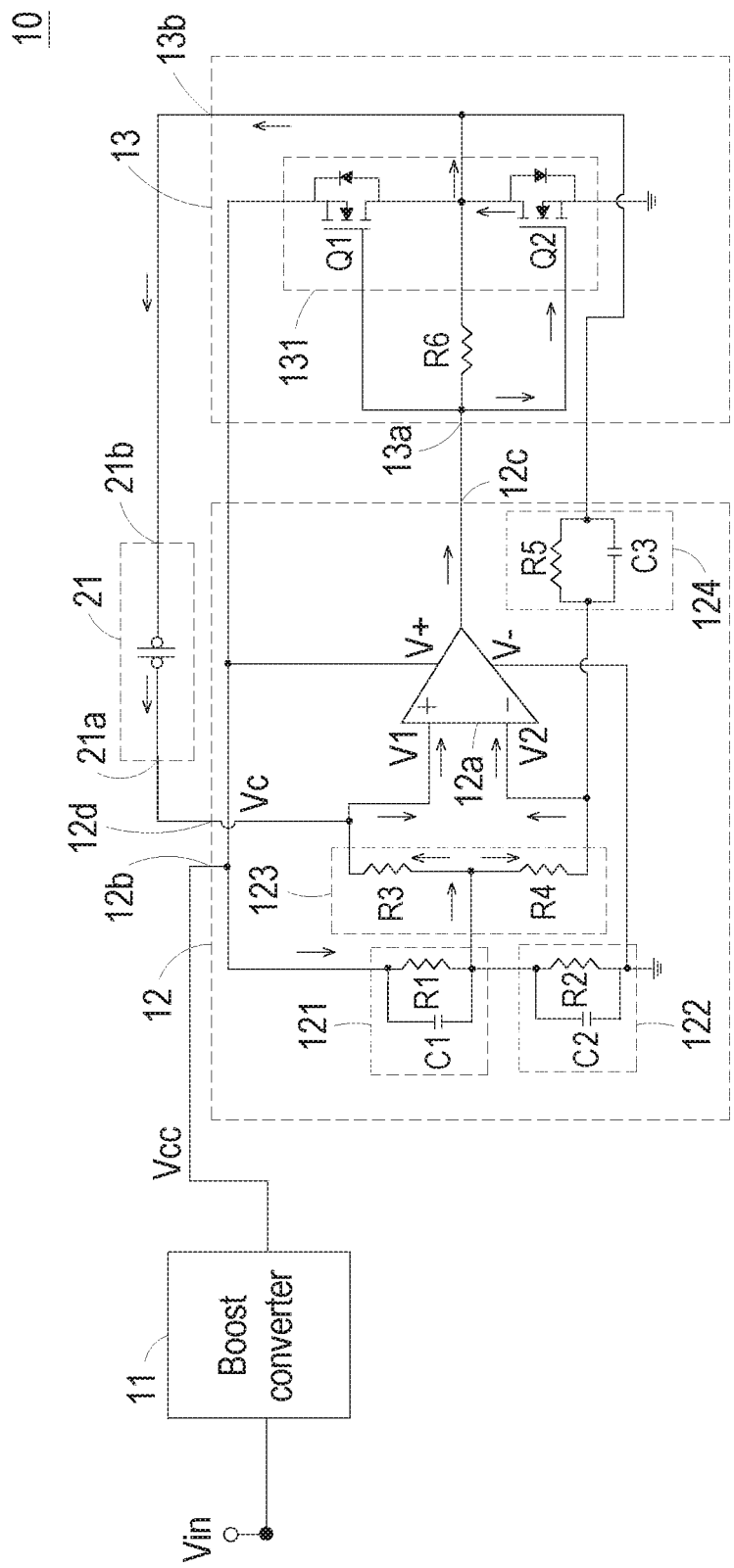

FIGS. 3A and 3B are schematic circuit diagrams illustrating the operations of the driving circuit according to the present invention. Please refers to FIGS. 1 and 3A. When the piezoelectrically actuated pump 20 is desired to be operated, the control circuit 12 receives the constant voltage $V_{cc}$, and the constant voltage $V_{cc}$ is divided into the first voltage $V_1$ and the second voltage $V_2$ by the voltage-division circuit 123. Under this circumstance, the comparator 12a receives the first voltage $V_1$ and the second voltage $V_2$, compares the first voltage $V_1$ with the second voltage $V_2$, and outputs a positive voltage V+ or a negative voltage V− according to the comparing result.

When the comparator 12a determines that the first voltage $V_1$ is larger than the second voltage $V_2$, the comparator 12a outputs the positive voltage V+ (see the arrow as indicated in FIG. 3A). Under this circumstance, the first switch element Q1 of the half-bridge circuit 131 is conducted, and the second switch element Q2 of the half-bridge circuit 131 is shut off. The voltage switch circuit 13 outputs the positive voltage V+ to the input terminal 21b of the piezoelectric actuator load 21. Meanwhile, the voltage at the output terminal 21a of the piezoelectric actuator load 21 is negative voltage V−, which has minor voltage drop. Namely, the conducting voltage of the piezoelectric actuator load 21 is negative voltage V− so that the piezoelectric actuator load 21 is regarded as outputting the negative voltage V−. Under this circumstance, the negative voltage V− is transmitted to the first voltage output unit of the voltage-division circuit 123, and the negative voltage V− is converted into the first voltage $V_1$ and provided to the positive input terminal of the comparator 12a. Consequently, the comparator 12a can compare the first voltage $V_1$ with the second voltage $V_2$, which is a division voltage of the constant voltage $V_{cc}$ outputted from the boost converter 11. In addition, due to that a voltage difference is formed between the input terminal 21b and the output terminal 21a of the piezoelectric actuator load 21, the conductive negative voltage V− of the piezoelectric actuator load 21 can be utilized by the frequency adjustment circuit 121 (i.e. the first resistor R1 and the first capacitor C1 connected in parallel with each other), and the frequency adjustment circuit 121 can detect the resonant operating frequency according to the minor voltage $V_c$ outputted form the output terminal 21a of the piezoelectric actuator load 21. Consequently, an optimized operating frequency for the piezoelectric actuator load 21 is adjusted.

Thereafter, the negative voltage V−, which has minor voltage drop, is transmitted to the first voltage output unit and converted into the first voltage $V_1$ to be provided to the comparator 12a. When the comparator 12a determines that the first voltage $V_1$ is smaller than the second voltage $V_2$, the comparator 12a outputs the negative voltage V− at the output terminal (see the arrow as indicated in FIG. 3B). Under this circumstance, the second switch element Q2 of the half-bridge circuit 131 is conducted, and the first switch element Q1 of the half-bridge circuit 131 is shut off. The voltage switch circuit 13 receives the negative voltage V− and feedbacks the negative voltage V− to the input terminal 21b of the piezoelectric actuator load 21. Meanwhile, the voltage at the output terminal 21a of the piezoelectric actuator load 21 is positive voltage V+, which has minor voltage drop. Namely, the conducting voltage of the piezoelectric actuator load 21 is positive voltage V+ so that the piezoelectric actuator load 21 is regarded as outputting the positive voltage V+. Under this circumstance, the positive voltage V+ is transmitted to the first voltage output unit of the voltage-division circuit 123, and the positive voltage V+ is converted into the first voltage $V_1$ and provided to the positive input terminal of the comparator 12a. Consequently, the comparator 12a can compare the first voltage $V_1$ with the second voltage $V_2$, which is a division voltage of the constant voltage $V_{cc}$ outputted from the boost converter 11. By repeating the above cycles, the control circuit 12 and the voltage switch circuit 13 form a resonant circuit, which allows the electrical energy to be converted into mechanical energy by the piezoelectric actuator load 21 according to the variety of positive voltage V+ and negative voltage V− of the minor voltage $V_c$ outputted form the output terminal 21a of the piezoelectric actuator load 21. Consequently, the piezoelectrically actuated pump 2 is driven to operate correspondingly. Certainly, the frequency adjustment circuit 121 (i.e. the first resistor R1 and the first capacitor C1 connected in parallel with each other) of the control circuit 12 can detect and adjust the resonant operating frequency of the piezoelectric actuator load 21 automatically. Consequently, the operating frequency of the piezoelectric actuator load 21 is adjusted to a required operating frequency, and the piezoelectric actuator load 21 is operated at an optimized condition.

Comparing with the conventional driving circuit, the inventive driving circuit 10 can utilize the frequency adjustment circuit 121 of the control circuit 12 (i.e. the first resistor R1 and the first capacitor C1 connected in parallel with each other) to detect the variety of the minor voltage $V_c$ outputted form the output terminal 21a of the piezoelectric actuator load 21 automatically so as to adjust the operating frequency. For example, when two different piezoelectric actuator loads 21 are used and have operating frequencies of 18 kHz and 23 kHz respectively, the optimized resonant frequencies of the two piezoelectric actuator loads 21 can be obtained by the frequency adjustment circuit 121 of the control circuit 12 (i.e. the first resistor R1 and the first capacitor C1 connected in parallel with each other). Namely, the inventive driving circuit 10 can drive both of the two piezoelectric actuator loads 21 to convert the electrical energy into mechanical energy. Consequently, the piezoelectrically actuated pump 20 is driven to operate correspondingly without employing plural driving circuits.

In summary, the prevent invention provides a driving circuit applicable to various piezoelectric actuator load with different operating frequencies. Namely, the driving circuit is applicable to different piezoelectrically actuated pumps. Consequently, the cost is reduced significantly. The inventive driving circuit is capable of adjusting the operating frequency of the piezoelectric actuator to a required operating frequency automatically. Consequently, different piezoelectric actuators of the piezoelectrically actuated pumps can be operated at optimized operating conditions, respectively.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving circuit for a piezoelectrically actuated pump, wherein the piezoelectrically actuated pump comprises a piezoelectric actuator load, the driving circuit comprising:
    a boost converter receiving an input voltage and converting the input voltage into a constant voltage;
    a control circuit electrically connected with the boost converter, receiving the constant voltage outputted form the boost converter, and comprising a voltage-division circuit, a comparator and a frequency adjustment circuit, wherein the constant voltage is divided into a first voltage and a second voltage by the voltage-division circuit, and the comparator compares the first voltage with the second voltage and outputs a positive voltage or a negative voltage according to a comparing result; and
    a voltage switch circuit electrically connected with the control circuit, receiving the positive voltage or the negative voltage outputted from the comparator, and comprising a half-bridge circuit comprising a first switch element and a second switch element, wherein the voltage switch circuit receives the positive voltage or the negative voltage outputted from the comparator and feedbacks the positive voltage or the negative voltage to the piezoelectric actuator load so as to form a required positive voltage or a required negative voltage;
    wherein the control circuit and the voltage switch circuit form a resonant circuit to control the operation of the piezoelectric actuator load according to the variety of the minor voltage outputted form the piezoelectric actuator load, and the frequency adjustment circuit of the control circuit detects and adjusts the variety of the minor voltage outputted from the piezoelectric actuator load automatically so as to adjust an operating frequency of the piezoelectric actuator load to a required operating frequency.

2. The driving circuit according to claim 1, wherein the control circuit comprises:
    an input terminal for receiving the constant voltage outputted from the boost converter; and
    an input-end voltage regulation circuit electrically connected with the input terminal of the control circuit and comprising a second resistor and a second capacitor connected in parallel with each other for regulating the constant voltage outputted from the boost converter.

3. The driving circuit according to claim 2, wherein the voltage-division circuit of the control circuit is electrically connected with the input terminal of the control circuit and comprises a third resistor and a fourth resistor, wherein the voltage-division circuit comprises:
    a first voltage output unit comprising the third resistor for outputting the first voltage to the comparator; and
    a second voltage output unit comprising the fourth resistor for outputting the second voltage to the comparator.

4. The driving circuit according to claim 3, wherein the frequency adjustment circuit of the control circuit is electrically connected with the input terminal of the control circuit and comprises a first resistor and a first capacitor connected in parallel with each other, wherein one terminal of the frequency adjustment circuit receives the constant voltage outputted from the boost converter and the other terminal of the frequency adjustment circuit is electrically connected with the voltage-division circuit, wherein the first voltage output unit is electrically connected with an output terminal of the piezoelectric actuator load, and the frequency adjustment circuit detects and adjusts the variety of the minor voltage outputted from the piezoelectric actuator load automatically so as to adjust the operating frequency of the piezoelectric actuator load to the required operating frequency.

5. The driving circuit according to claim 3, wherein the control circuit comprises an output-end voltage regulation circuit electrically connected with the second voltage output unit of the voltage-division circuit and comprises a fifth resistor and a third capacitor connected in parallel with each other, wherein one terminal of the output-end voltage regulation circuit is electrically connected with the second voltage output unit of the voltage-division circuit, and the other terminal of the output-end voltage regulation circuit is electrically connected with an input terminal of the piezoelectric actuator load for regulating the voltage at the input terminal of the piezoelectric actuator load.

6. The driving circuit according to claim 1, wherein when the comparator determines that the first voltage is larger than the second voltage, the comparator outputs the positive voltage.

7. The driving circuit according to claim 1, wherein when the comparator determines that the first voltage is lower than the second voltage, the comparator outputs the negative voltage.

8. The driving circuit according to claim 1, wherein the voltage switch circuit comprises a sixth resistor for regulating voltage and limiting current, wherein one end of the sixth resistor is electrically connected with an output terminal of the comparator, and the other end of the sixth resistor is electrically connected with the piezoelectric actuator load.

9. The driving circuit according to claim 2, wherein a first end of the first switch element is electrically connected with a first end of the second switch element and further electrically connected with an output terminal of the comparator, a second end of the first switch element is electrically connected with a second end of the second switch element and further electrically connected with piezoelectric actuator load, and a control end of the first switch element is electrically connected with the input terminal of the control circuit, and a control end of the second switch element is ground.

10. The driving circuit according to claim 9, wherein when the comparator of the control circuit outputs the positive voltage, the first switch element of the half-bridge circuit is conducted for outputting the positive voltage, and the second switch element of the half-bridge circuit is shut off.

11. The driving circuit according to claim 9, wherein when the comparator of the control circuit outputs the negative voltage, the second switch element of the half-bridge circuit is conducted for outputting the negative voltage, and the first switch element of the half-bridge circuit is shut off.

* * * * *